(12) United States Patent
Kaizu et al.

(10) Patent No.: US 10,015,890 B2
(45) Date of Patent: Jul. 3, 2018

(54) METHOD OF MANUFACTURING CONDUCTIVE LAYER AND WIRING BOARD

(71) Applicant: FUJIKURA LTD., Tokyo (JP)

(72) Inventors: Masahiro Kaizu, Tokyo (JP); Masateru Ichikawa, Shizuoka (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 15/541,687

(22) PCT Filed: Dec. 17, 2015

(86) PCT No.: PCT/JP2015/085372
§ 371 (c)(1),
(2) Date: Jul. 5, 2017

(87) PCT Pub. No.: WO2016/111133
PCT Pub. Date: Jul. 14, 2016

(65) Prior Publication Data
US 2018/0027668 A1 Jan. 25, 2018

(30) Foreign Application Priority Data

Jan. 6, 2015 (JP) .................................. 2015-000768

(51) Int. Cl.
*H05K 1/11* (2006.01)
*H05K 3/46* (2006.01)
*H05K 3/10* (2006.01)

(52) U.S. Cl.
CPC ........... *H05K 3/4644* (2013.01); *H05K 1/115* (2013.01); *H05K 3/10* (2013.01); *H05K 2201/0137* (2013.01); *H05K 2201/0929* (2013.01); *H05K 2201/09609* (2013.01); *H05K 2203/0195* (2013.01); *H05K 2203/0776* (2013.01); *H05K 2203/1131* (2013.01)

(58) Field of Classification Search
CPC . H05K 1/11; H05K 1/115; H05K 3/10; H05K 3/46; H05K 3/4644
USPC ........................... 174/262; 427/58, 553, 557
See application file for complete search history.

(56) References Cited

U.S. PATENT DOCUMENTS

2009/0181184 A1   7/2009   Pope et al.
2010/0098874 A1   4/2010   Schroder
(Continued)

FOREIGN PATENT DOCUMENTS

JP   2005-177710 A   7/2005
JP   2012-505966 A   3/2012
(Continued)

*Primary Examiner* — Xiaoliang Chen
(74) *Attorney, Agent, or Firm* — Osha Liang LLP

(57) ABSTRACT

A method of manufacturing a conductive layer on a support body includes a first process of forming a precursor layer containing at least one of metal particles and metal oxide particles on the support body; a second process of forming a sintering layer by irradiating an electromagnetic wave pulse on the precursor layer; and a third process of compressing the sintering layer. The conductive layer is formed by repeating the first to third processes "N" times, where "N" denotes a natural number equal to or greater than 2, on the same location of the support body, and the third process performed in the first to (N−1)th operations includes forming a surface of the sintering layer in an uneven shape.

9 Claims, 15 Drawing Sheets

(56) References Cited

U.S. PATENT DOCUMENTS

| | | | |
|---|---|---|---|
| 2011/0262657 A1 | 10/2011 | Pope et al. | |
| 2014/0308460 A1 | 10/2014 | Uchida | |
| 2015/0176133 A1 | 6/2015 | Pope et al. | |
| 2015/0194235 A1 | 7/2015 | Kariya et al. | |
| 2017/0027063 A1 | 1/2017 | Schroder et al. | |
| 2017/0285261 A1* | 10/2017 | Miyamoto | C03C 25/1063 |

FOREIGN PATENT DOCUMENTS

| | | |
|---|---|---|
| JP | 2014-534605 A | 12/2014 |
| WO | 2014/050466 A1 | 4/2014 |
| WO | 2014/088546 A1 | 6/2014 |

\* cited by examiner

Fig.6 (a)
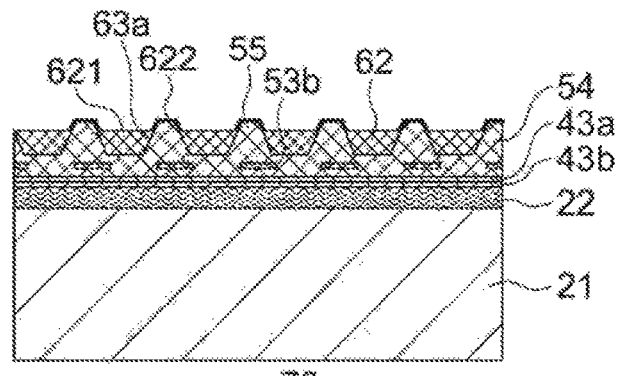
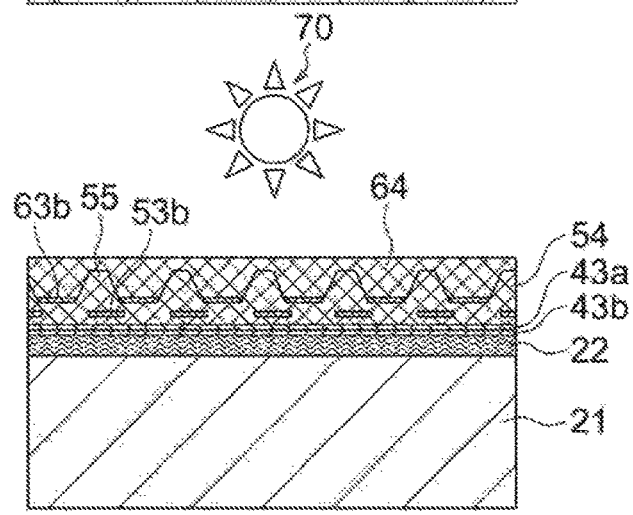
Fig.6 (b)
Fig.6 (c)
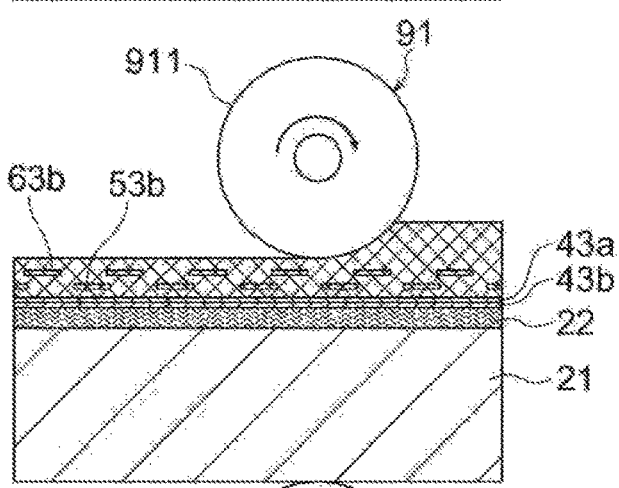
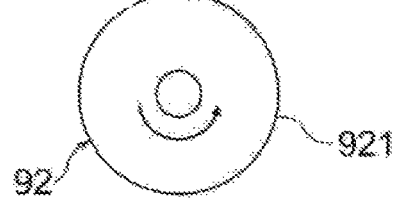

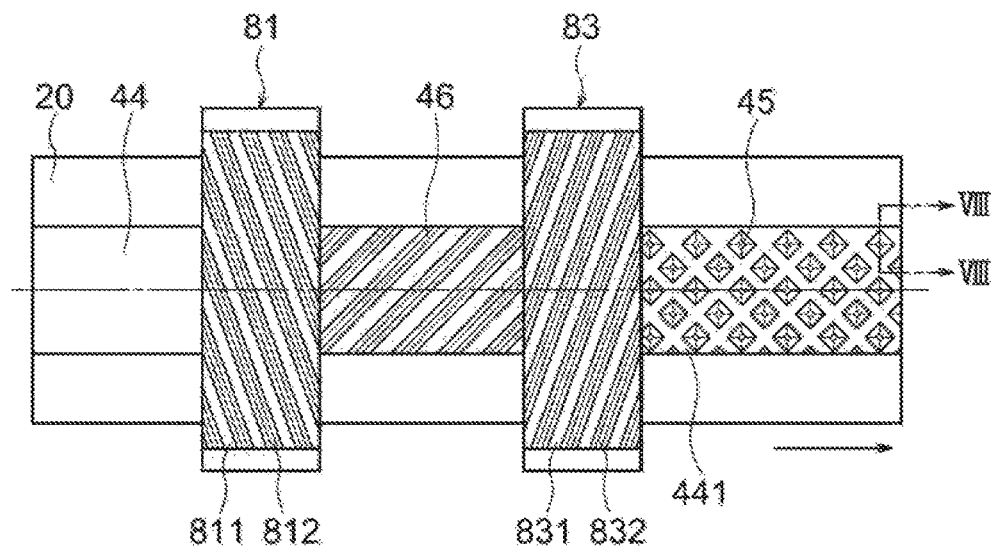
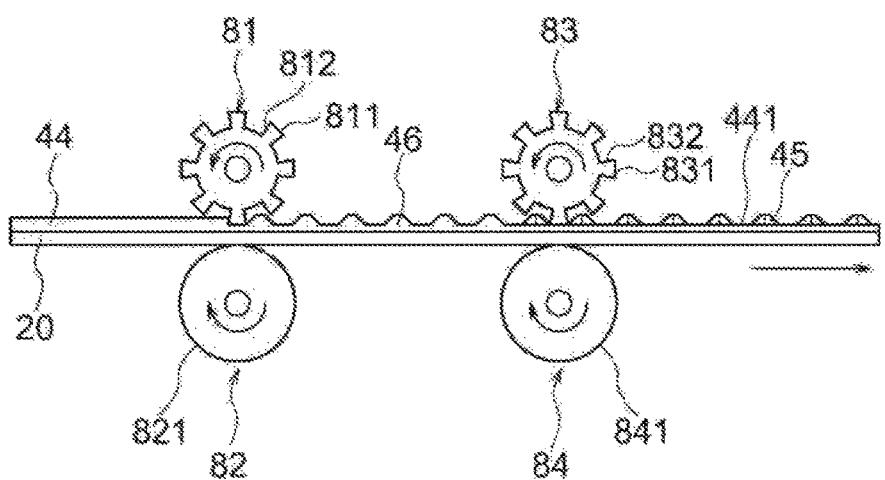

METHOD OF MANUFACTURING CONDUCTIVE LAYER AND WIRING BOARD

TECHNICAL FIELD

The present invention relates to a method of manufacturing a conductive layer by forming the conductive layer on a support body and a wiring board including a substrate and the conductive layer.

For designated countries which permit the incorporation by reference, the contents described and/or illustrated in the documents relevant to Japanese Patent Application No. 2015-000768 filed on Jan. 6, 2015 will be incorporated herein by reference as a part of the description and/or drawings of the present application.

BACKGROUND ART

There is known a method of for conductive thin film on a substrate by depositing a dispersion liquid containing metal oxide and a reducing agent on the substrate to form a thin film, and exposing the thin film to an electromagnetic radiation pulse to reduce and sinter the metal oxide (for example, see Patent Document 1).

CITATION LIST

Patent Document

Patent Document 1: JP 2012-505966 W

The conductive thin film manufactured through the aforementioned manufacturing method has a porous structure by virtue of a discharge of a carbonic acid gas or the like generated in a reduction reaction. For this reason, since the number of electric junction points is small, an electric resistivity is high. In addition, since hard and fragile, the conductive thin film fails to follow deformation of the substrate sand is finally exfoliated. In order to address this, it is possible to increase the number of metal crystal junction points inside the conductive thin film and improve an adhering strength between the conductive thin film and the substrate by compressing the conductive thin film using a pressing tool such as a roller after sintering.

The conductive thin compressed in this manner is very thin with a thickness of 5 to 20 μm. In addition, since it is not a metal crystal chunk, an electric resistivity of the conductive thin film is worse than a value of the bulk state of the conductive metal. In this regard, focusing on a fact that the resistance value can be reduced by increasing the thickness of the conductive layer, it is conceived that the thickness of the conductive layer can increase by simply repeating the aforementioned manufacturing method for the base material several times to laminate a plurality of conductive thin films. However, when the thin film containing metal oxide is exposed to the electromagnetic radiation pulse to perform reduction and sintering, the metal oxide remains in the lower layer part of the thin film without being reduced. Since this metal oxide is an electric insulation material, the laminated conductive thin films are electrically insulated from each other by the remaining metal oxide layer. As a result, it may be disadvantageously difficult to reduce the electric resistance value of the conductive layer and to implement an anticipated characteristic value such as the electric resistance value depending on the thickness of the entire conductive layer.

SUMMARY

One or more embodiments of the invention provide a method of manufacturing a conductive layer, by which the conductive layer having a desired thickness can be formed using a photo-sintering process, and a wiring board including the conductive layer.

[1] A method of manufacturing a conductive layer according to one or more embodiments of the invention is a method of manufacturing a conductive layer on a support body, the method includes: a first process of forming a precursor layer containing at least one of metal particles and metal oxide particles on the support body; a second process of forming a sintering layer by irradiating an electromagnetic wave pulse on the precursor layer; and a third process of compressing the sintering layer, the conductive layer is formed by repeating the first to third processes "N" times (where "N" denotes a natural number equal to or greater than "2") for the same location of the support body, and the third process performed in the first to (N−1)th operations includes forming a surface of the sintering layer in an uneven shape.

[2] in one or more embodiments of the invention, the uneven surface of the sintering layer compressed in the third process of the first to (N−1)th operations may include convex portions, and each of the convex portions may have a trapezoidal cross-sectional shape narrowed toward a tip end surface or a rectangular cross-sectional shape.

[3] In one or more embodiments of the invention, the convex portions may include protrusions arranged in a matrix shape.

[4] in one or more embodiments of the invention, at least one of the third processes performed in the first to (N−1)th operations may include forming the surface of the sintering layer in an uneven shape by pressing a first pressing tool to the surface of the sintering layer and then pressing a second pressing tool to the surface of the sintering layer, the first pressing tool may have a first pressing surface including first grooves that extend along a first direction and are arranged. In parallel with each other, and the second pressing tool may have a second pressing surface including second grooves that extend along a second direction crossing the first direction and are arranged in parallel with each other.

[5] In one or more embodiments of the invention, at least one of the third processes performed in the first to (N−1)th operations may include forming the surface of the sintering layer in an uneven shape by pressing a pressing tool to the surface of the sintering layer, the pressing tool may have a pressing surface including concave portions shaped to correspond to the protrusions, and the concave portions may be arranged on the pressing surface to correspond to the arrangement of the protrusions.

[6] In one or more embodiments of the invention, the convex portions may include walls extending along a first direction, and the walls may be arranged in parallel with each other.

[7] In one or more embodiments of the invention, at least one of the third processes performed in the first to (N−1)th operations may include forming the surface of the sintering layer in an uneven shape by pressing a pressing tool to the surface of the sintering layer, and the pressing tool may have a pressing surface including grooves that extend along the first direction and are arranged in parallel with each other.

[8] In one or more embodiments of the invention, the first process may include arranging a dispersion liquid containing at least one of the metal particles and the metal oxide particles on the support body, and forming the precursor layer by drying the dispersion liquid.

[9] In one or more embodiments of the invention, the third process of the (N)th operation may include forming the surface of the sintering layer in a flat shape.

[10] A wiring board according to one or more embodiments of the invention is a wiring hoard including a substrate and a conductive layer provided on the substrate, the conductive layer includes: a conductive portion containing metal and having electric conductivity; and at least an insulating portion containing metal oxide and having an electric insulation property, the insulating portion is buried in the conductive portion and extends in layered state along substantially the same direction as an extending direction of e substrate, and the insulating portion has penetrating portions where the conductive portion penetrates.

[11] In one or more embodiments of the invention, the penetrating portions may include through-holes arranged in a matrix shape in e insulating portion.

[12] In one or more embodiments of the invention, the penetrating portions may include slits arranged in parallel with each other in the insulating portion.

Effect of the Invention

According to one or more embodiments of the invention, when three processes including the third process of compressing the sintering layer are repeated "N" times, the third processes of the first to (N−1)th operations include forming a surface of the sintering layer in an uneven shape. For this reason, it is possible to form the conductive layer having a desired thickness using the photo-sintering process.

BRIEF DESCRIPTION OF DRAWINGS

FIGS. 6(a) to 6(c) are cross-sectional views illustrating each part of FIG. 1 (Part 5);

FIGS. 7(a) and 7(b) area plan view and a side view illustrating a pressing roller used in step S24 of FIG. 1;

DETAILED DESCRIPTION

Embodiments of the invention will now be described with reference accompanying drawings.

Figure 1:
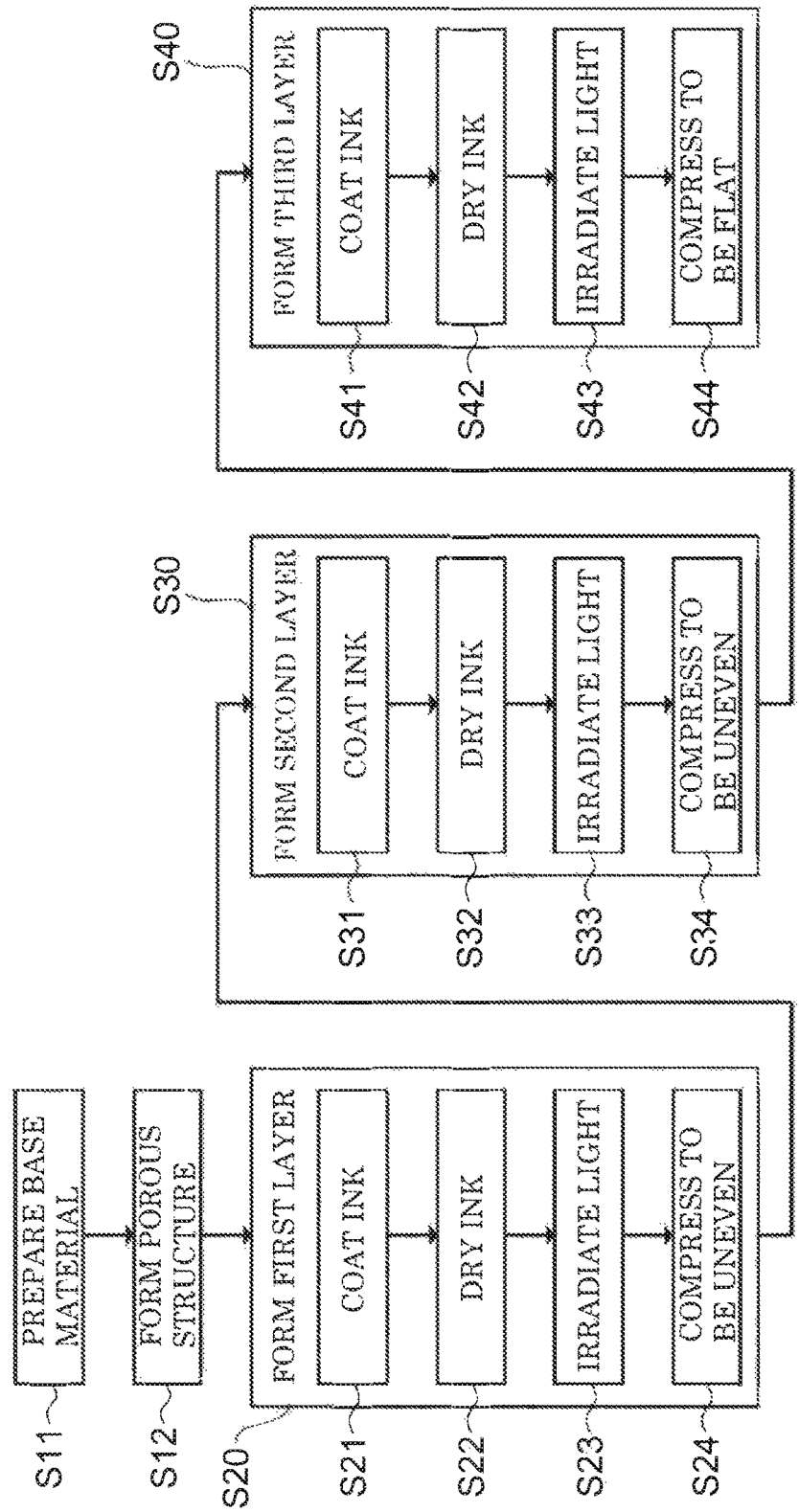
FIG. 1 is a flowchart illustrating a method of manufacturing a conductive layer in one or more embodiments of the invention.
Figure 2:
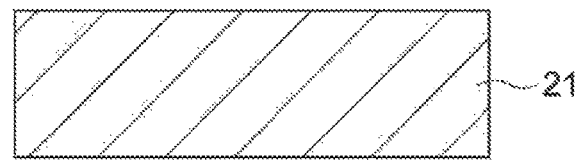
FIGS. 2(a) to 2(d) are cross-sectional views illustrating each step of FIG. 1 (Part 1)
Figure 2:
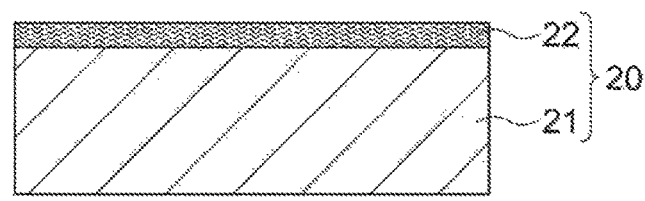
Figure 2:
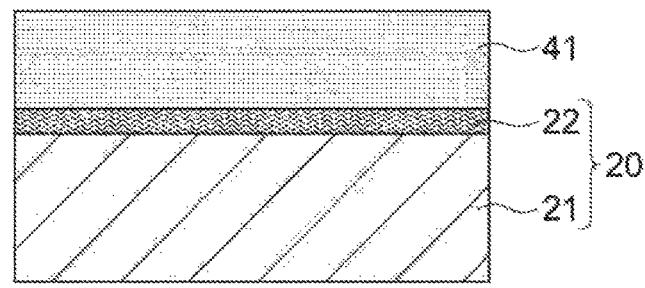
Figure 2:
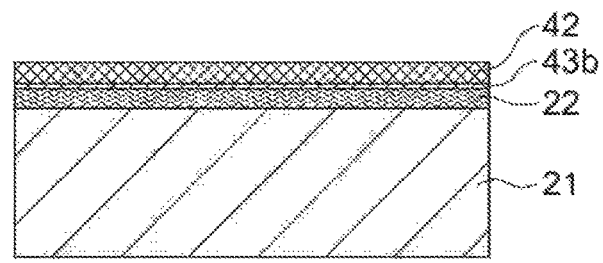
Figure 3:
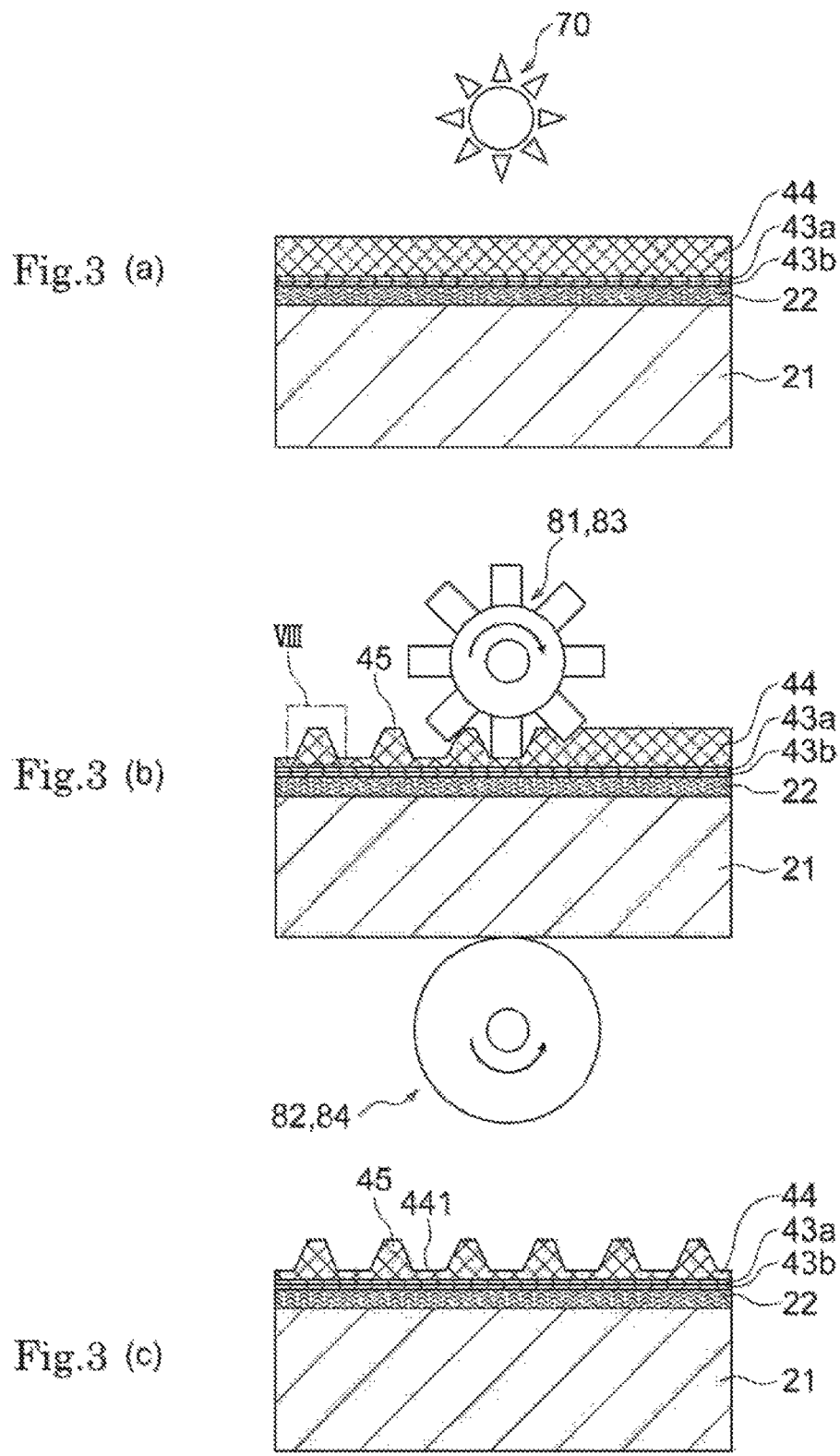
FIGS. 3(a) to 3(c) are cross-sectional views illustrating each step of FIG. 1 (Part 2)
Figure 4:
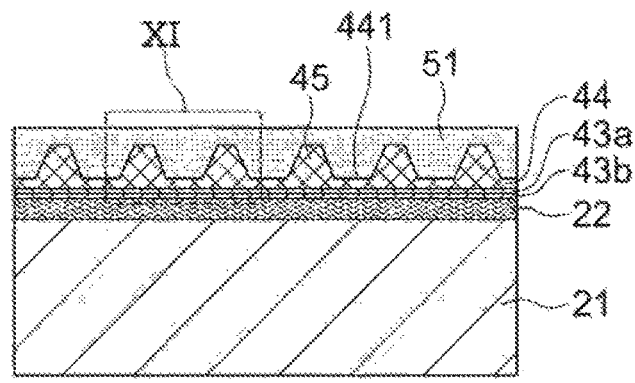
FIGS. 4(a) to 4(c) are cross-sectional views illustrating each step of FIG. 1 (Part 3)
Figure 4:
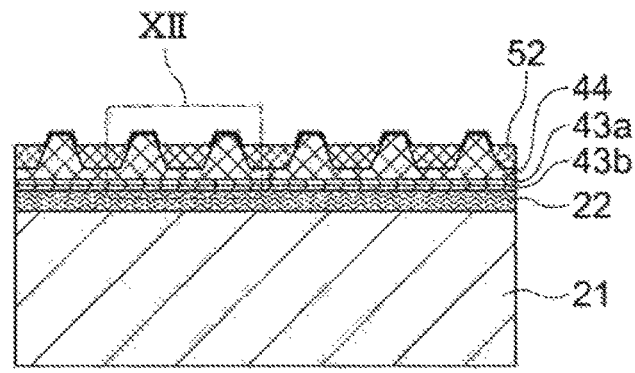
Figure 4:
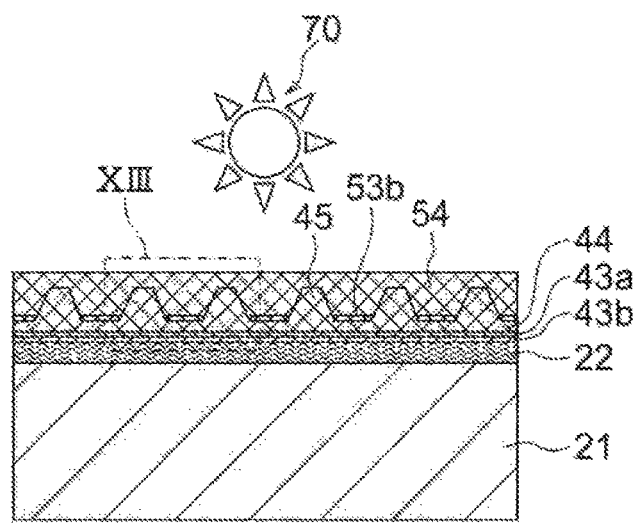
Figure 5:
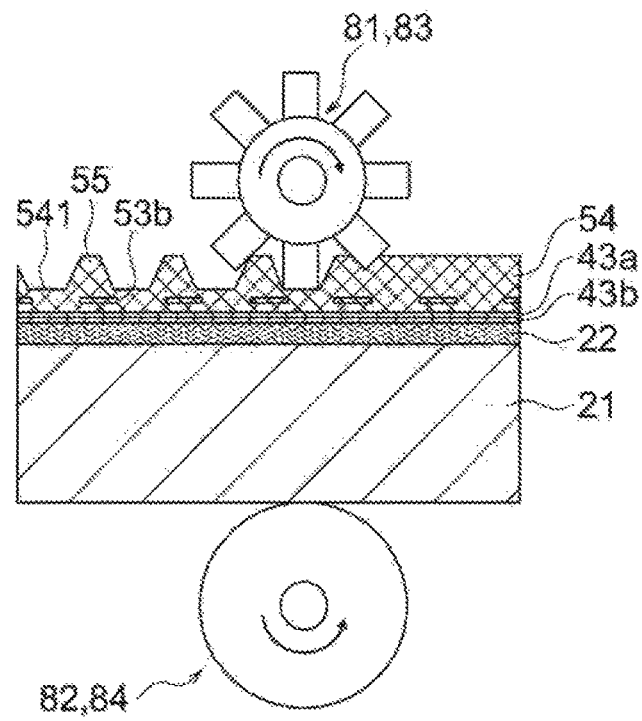
FIGS. 5(a) to 5(c) are cross-sectional views illustrating each step of FIG. 1 (Part 4)
Figure 5:
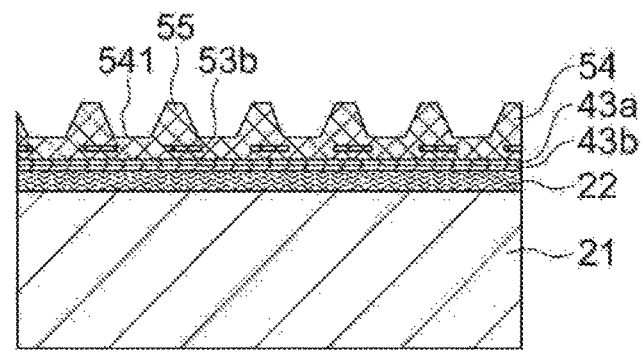
Figure 5:
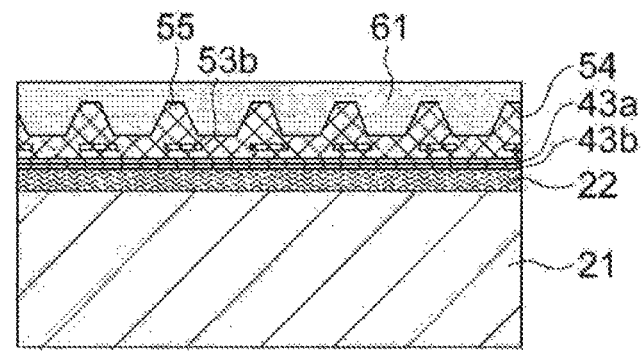
Figure 8:
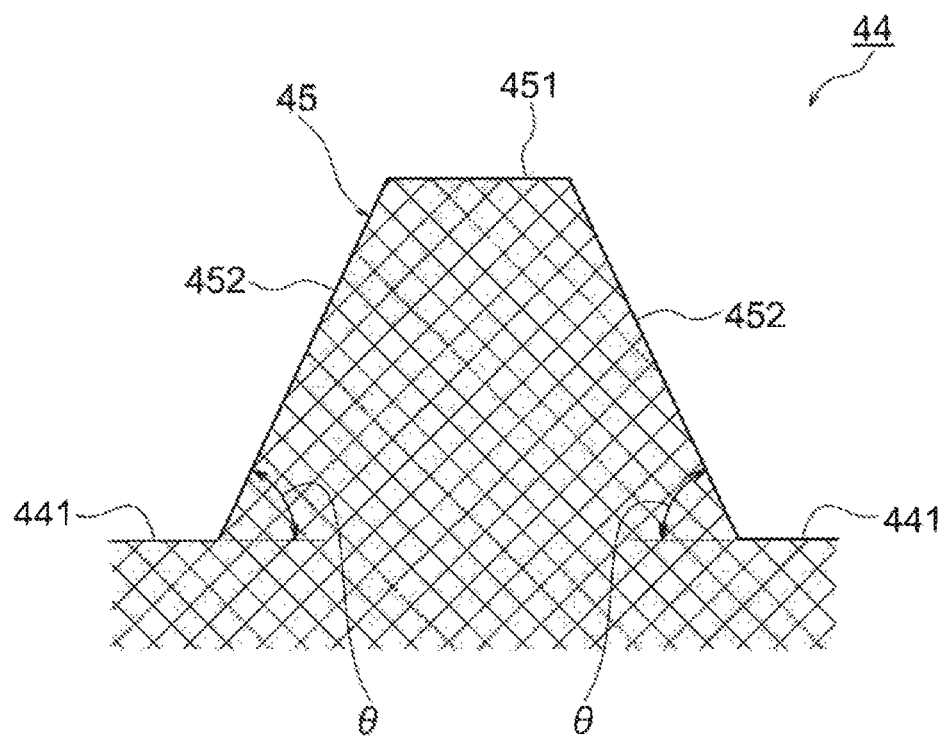
FIG. 8 is an enlarged view illustrating a portion VIII of FIG. 3(b) and a cross-sectional view taken along the line VIII-VIII of FIG. 7(a)
Figure 9:
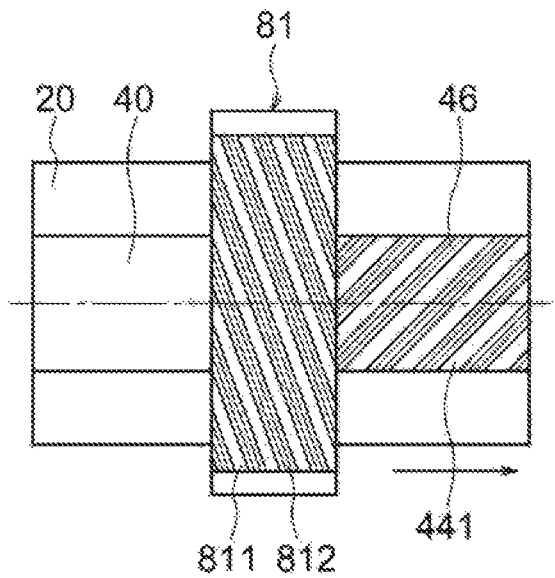
FIGS. 9(a) and 9(b) are a plan view and a side view illustrating a first modification of the pressing roller used in step S24 of FIG. 1.
Figure 9:
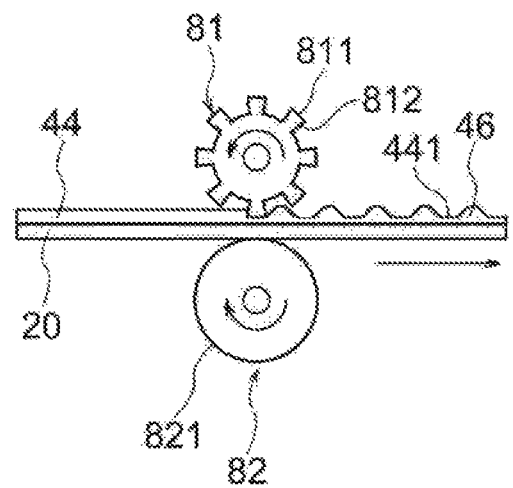
Figure 10:
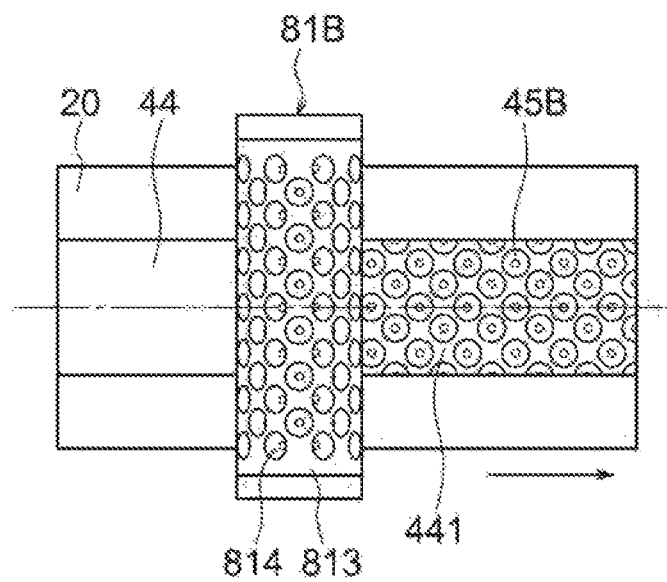
FIGS. 10(a) and 10(b) are a plan view and a side view illustrating a second modification of the pressing roller used in step S24 of FIG. 1.
Figure 10:
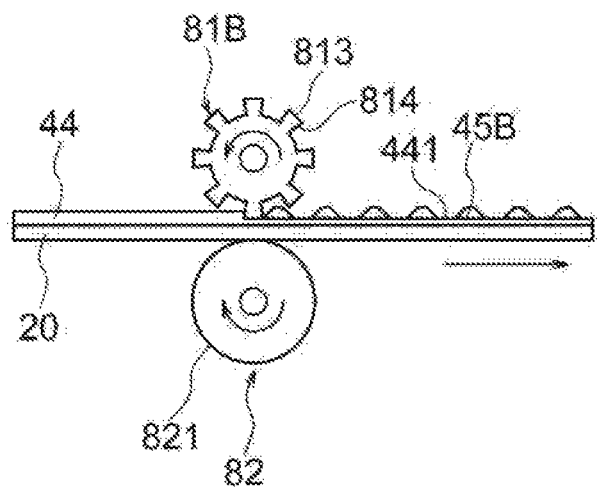
Figure 11:
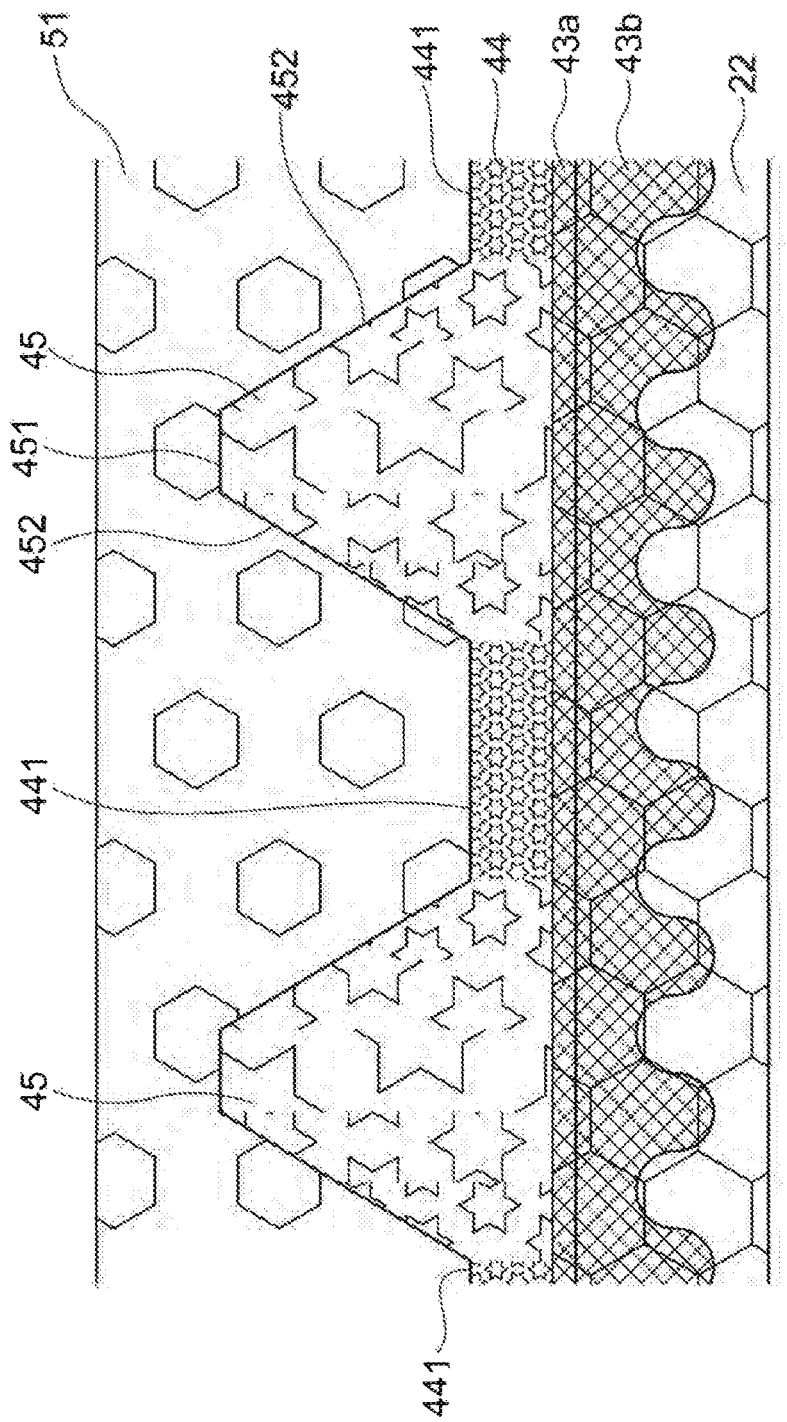
FIG. 11 is an enlarged view illustrating a portion XI of FIG. 4(a)
Figure 12:
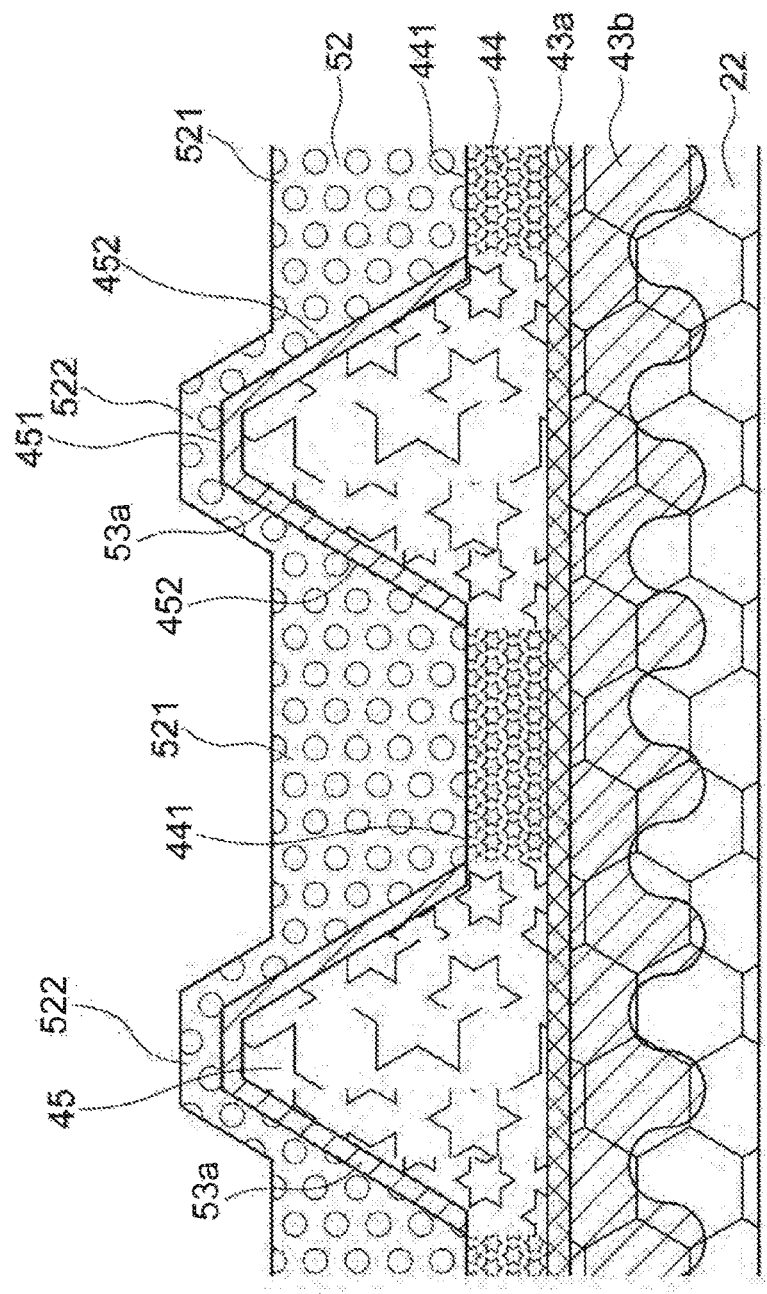
FIG. 12 is an enlarged view illustrating a portion XII of FIG. 4(b)
Figure 13:
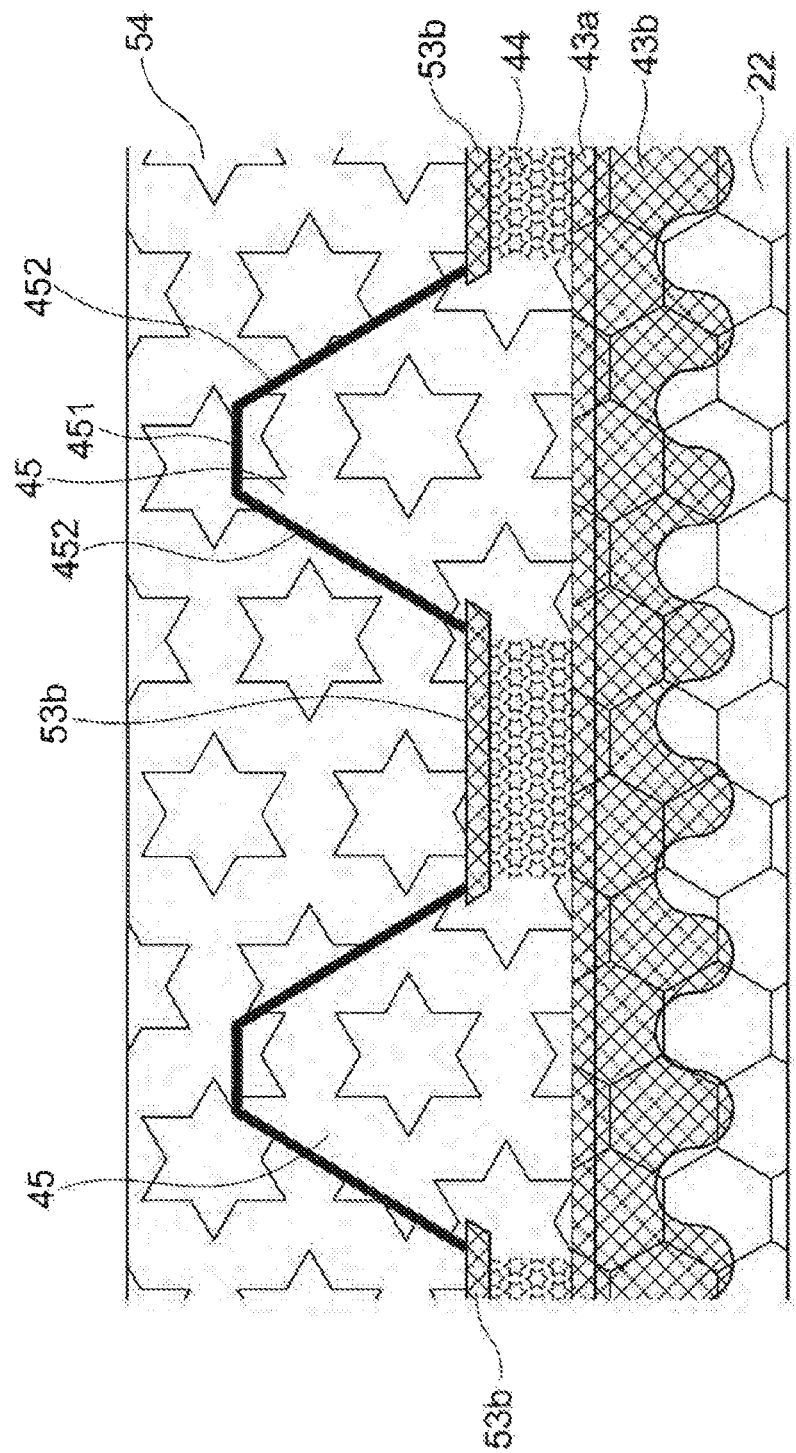
FIG. 13 is an enlarged view illustrating a portion XIII of FIG. 4(c)

FIG. 1 is a flowchart illustrating a method of manufacturing a conductive layer in one or more embodiments of the invention, and FIGS. 2(a) to 6(c) are cross-sectional views illustrating each step of FIG. 1. FIGS. 7(a) and 7(b) are diagrams illustrating a pressing roller, and FIG. 8 is an enlarged view illustrating a portion VIII of FIG. 3(b). FIGS. 9(a) and 9(b) are diagrams illustrating a first modification of the pressing roller, and FIGS. 10(a) and 10(b) are diagrams illustrating a second modification the pressing roller. FIG. 11 is an enlarged view illustrating a portion XI of FIG. 4(a), and FIG. 12 is an enlarged view illustrating a portion XII of FIG. 4(b). FIG. 13 is an enlarged view illustrating a portion XIII of FIG. 4(c).

Figure 14:
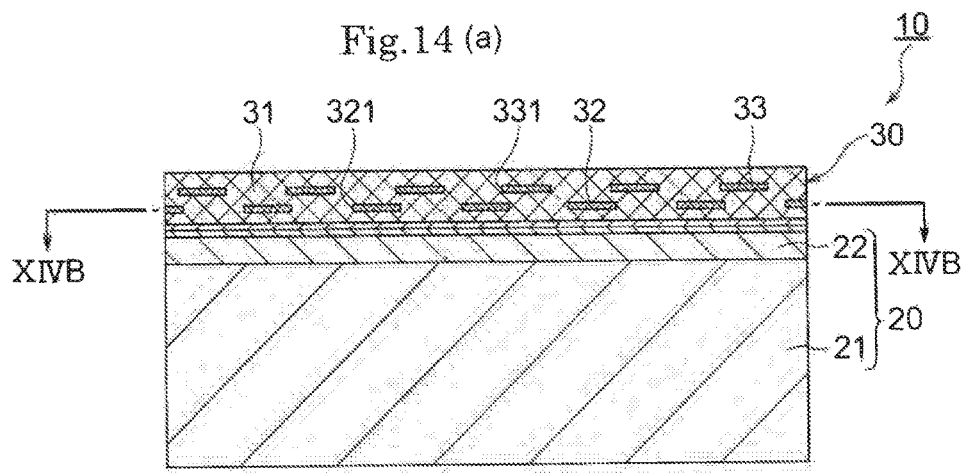
FIG. 14(a) is a cross-sectional view illustrating a structure of a wiring hoard in one or more embodiments of the invention.
FIG. 14(b) is a cross-sectional view taken along the line XIVB-XIVB of FIG. 14(a)
Figure 14:
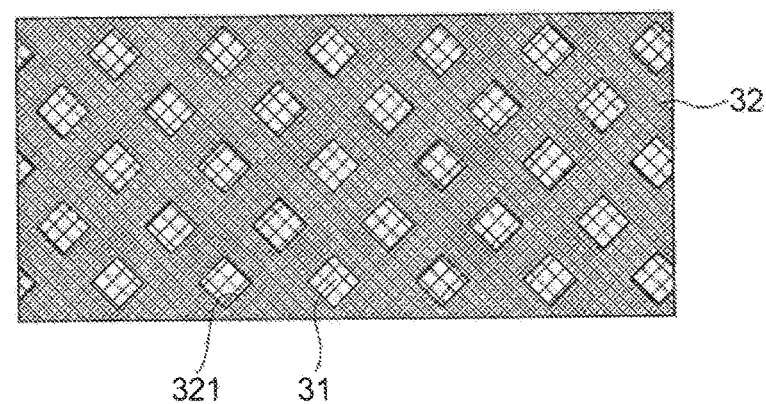

A method of manufacturing a conductive layer 30 is a method of forming the conductive layer 30 having a desired thickness on substrate 20 (refer to FIG. 14(a)) using a photo-sintering process.

In one or more embodiments, as illustrated in FIG. 1, first, the substrate 20 is provided by forming a porous layer 22 on a base material 21 (steps S11 and S12 of FIG. 1), and then, a first sintering layer 44 is formed on the substrate 20 (step S20). Then, a second sintering layer 54 is formed on the first sintering layer 44 (step S30), and a third sintering layer 64 is formed on the second sintering layer 54 (step S40). As a result, the conductive layer 30 is formed on the substrate 20. That is, in one or more embodiments, the conductive layer 30 is provided by forming the sintering layers 44, 54, and 64 on the same location of the substrate 20 repeatedly (three times in this example).

Each process of the method of manufacturing the conductive layer 30 in one or more embodiments will now be described.

First, in step S11 of FIG. 1, a base material 21 is prepared as illustrated in FIG. 2(a). This base material 21 has, for example, a film shape or a plate shape, but not particularly limited thereto. Specifically, this base material 21 may be made of, for example, resin, glass, metal, semiconductor, paper, wood, or a composite material thereof. In particular, the resin of the base material 21 may include, for example, polyimide, polyethylene terephthalate, polyethylene naphthalate, polyethylene, polycarbonate, polystyrene, polyvinyl chloride, acrylic resin, acrylonitrile butadiene styrene (ABS) copolymer resin, or the like.

Then, in step S12 of FIG. 1, a porous layer (primary layer) 22 is formed on the base material 21 as illustrated in FIG. 2(b) to provide the substrate 20. As such a porous layer 22, for example, the layer discussed in JP 2014-57024. A may be employed. The substrate 20 corresponds to an example of the support body or the substrate in one or more embodiments of the invention.

This porous layer 22 has a plurality of internal minute pores. These minute pores are connected to each other, so that a fluid can pass from one surface to the other surface through the minute pores. This porous layer 22 is provided by coating a porous layer formation material on the base material 21 and drying the porous layer formation material to remove a solvent. As a specific example of the porous layer formation material, a solution obtained by diluting and dispersing a porous material with a solvent may be employed. As the porous material, particles of silica (silicon oxide), titania (titanium oxide), zirconia (zirconium oxide), alumina (aluminum oxide), and the like may be employed. In addition, water, polyvinyl alcohol; or the like may be employed as the solvent.

The method of coating the porous layer formation material may include, but not particularly limited to, screen printing, photogravure printing, offset printing, photogravure offset printing, flexographic printing, inkjet printing, a roll coat method, a spin coating method, a dipping method, a spray coating method, a dispense coating method, a jet dispense method, and the like.

Then, in step S21 of FIG. 1, a first ink layer 41 is formed by coating metal oxide ink on the substrate 20 as illustrated in FIG. 2(c). The metal oxide ink corresponds to an example of the dispersion liquid in one or more embodiments of the invention.

The metal oxide ink is a solution containing metal oxide particles and a reducing agent. As a specific example of the metal oxide particles, for example, nano particles of copper oxide ($Cu_2O$, $CuO$), silver oxide ($Ag_2O$), molybdenum oxide ($MoO_2$, $MoO_3$), tungsten oxide ($WO_2$, $WO_3$), or the like may be employed. As the reducing agent, a material containing carbon atoms serving as a reducing group in the reduction reaction of the metal oxide may be employed. For example, a hydrocarbon-based compound such as ethylene glycol may be employed. In addition, as a solvent contained in the solution of the metal oxide ink, for example, water or various organic solvents may be employed. Furthermore, the metal oxide ink may contain a polymer compound as a binder or various modifiers such as a surfactant. Note that, if silver oxide ($Ag_2O$) is employed as the metal oxide particles, the reducing agent is not necessary.

In addition to the metal oxide particles, noble metal particles such as silver (Ag), platinum (Pt), and gold (Au) may also be employed. Alternatively, instead of the metal oxide particles, noble metal particles such as silver (Ag), platinum (Pt), and gold (Au) may also be employed. In this case, the reducing agent is not necessary.

The method of coating the metal oxide ink on the substrate 20 may include, but not particularly limited to, screen printing, photogravure printing, offset printing, photogravure offset printing, flexographic printing, inkjet printing, a roll coat method, a spin coating method, a dipping method, a spray coating method, a dispense coating method, a jet dispense method, and the like.

Note that the porous layer 22 described above is formed to secure a strong fixing strength between the base material 21 and the conductive layer 30 when the metal oxide ink does not easily permeate the base material 21. Therefore, if the base material 21 is made of a material easily permeated with the metal oxide, ink, such as paper or wood, the formation of this porous layer 22 is not necessary, and the metal oxide ink may be directly coated on the surface of the base material 21. In this case, the base material 21 corresponds to an example of the support body or the substrate in one or more embodiments of the invention.

Then, in step S22 of FIG. 1, the first metal oxide layer 42 is formed by drying the first ink layer 41 to remove the solvent as illustrated in FIG. 2(d). Specifically, the first ink layer 41 is dried at a temperature of 100 to 120° C. for 20 to 120 minutes. At this time, a part of the metal oxide ink infiltrated into the porous layer 12 is also dried, so that the first metal oxide layer 43b is formed. The first metal oxide layer 42 corresponds to an example of the precursor layer in one or more embodiments of the invention. Note that the first metal oxide layers 42 and 43b are layers containing the metal oxide particles (such as copper oxide) described above. Similarly, the metal oxide layers 43a, 52, 53a, 53b, 62, 63a, and 63b described below are also layers containing the metal oxide particles described above.

Then, in step S23 of FIG. 1, pulse light (electromagnetic wave pulse) is output from the light source 70 to the first metal oxide layer 42 as illustrated in FIG. 3(a). As a result, a reduction reaction and metal sintering for the metal oxide particles are progressed from the top surface of the first metal oxide layer 42 to form a first sintering layer 44. Along with this reduction reaction, a carbonic acid gas (or oxygen gas) or a solvent gas is discharged from the first metal oxide layer 42. Therefore, the first sintering layer 44 has a porous structure, in addition, at this time, light energy propagation is hindered by the first sintering layer 44 formed on top of the first metal oxide layer 42. Therefore, the first metal oxide layers 43a and 43b formed of unreacted metal oxides remain in the lower layer portion of the first metal oxide layer 42 and the inside of the porous layer 22. Note that the first sintering layer 44 is a layer containing metals (such as copper) obtained by reducing and sintering the metal oxide particles described above. Similarly, the sintering layers 54 and 64 described below are also layers containing metals obtained by reducing and sintering the metal oxide particles described above.

The light source 70 may include, but not particularly limited to, for example, a xenon lamp, a mercury lamp, a metal halide lamp, a chemical lamp, a carbon arc lamp, an infrared ray lamp, a laser irradiator, and the like. Wavelength components of the pulse light irradiated from the light source 70 may include visible light rays, ultraviolet rays, infrared rays, and the like. Note that wavelength components of the pulse light are not particularly limited to those described above as long as they are electromagnetic waves. For example, X-rays or microwaves may also be employed. In addition, the irradiation energy of the pulse light irradiated from the light source 70 may be set to, for example, 6.0 to 9.0 $J/cm^2$, and the irradiation time of the pulse light is set to approximately 2000 to 9000 μsec.

Then, in step S24 of FIG. 1, unevennesses are formed on the surface of the first sintering layer 44 as illustrated in FIGS. 3(b) and 3(c). In step S24, two sets of compressing rollers 81 to 84 illustrated in FIGS. 7(a) and 7(b) are used to compress the first sintering layer 44.

The first pressing roller 81 is a cylindrical roller made of a metal material such as stainless steel and has a pressing surface 811 having an unevenness shape provided with a plurality of first grooves 812. The first grooves 812 extend straightly along a first direction and are arranged substantially in parallel with each other. Meanwhile, the first pressure-receiving roller 82 is also a cylindrical roller made of a metal material such as stainless steel and has a smooth cylindrical pressure-receiving surface 821. The first pressure-receiving roller 821 is arranged oppositely to the first pressing roller 81.

Similar to the first pressing roller 81 described above, the second pressing roller 83 is also a cylindrical roller having an uneven pressing surface 831 provided with a plurality of second grooves 832 arranged substantially in parallel with each other. However, the second grooves 832 extend straightly along a second direction substantially perpendicular to the first direction described above. Meanwhile, similar to the first pressure-receiving roller 82 described above, the second pressure-receiving roller 84 is a cylindrical roller having a smooth pressure-receiving surface 841 and is arranged oppositely to the second pressing roller 83.

As the substrate 20 provided with the first sintering layer 44 passes between the first pressing roller 81 and the first pressure-receiving roller 82, a plurality of convex walls 46 are formed on the surface of the first sintering layer 44. The plurality of walls 46 extend straightly along the first direction and are arranged substantially parallel with each other. Then, as the substrate 20 passes between the second pressing roller 83 and the second pressure-receiving roller 84, a part of the plurality of convex walls 46 are crushed, so that a plurality of protrusions 45 are formed on the surface of the first sintering layer 44. The plurality of protrusions 45 are arranged with a predetermined pitch in the first direction and with a predetermined pitch in the second direction in a matrix shape.

A first set of compressing rollers 81 and 82 corresponds to an example of the first pressing tool in one or more embodiments of the invention. A second set of compressing rollers 83 and 84 corresponds to an example of the second pressing tool in one or more embodiments of the invention. The protrusion 45 corresponds to an example of the convex portion in one or mare embodiments of the invention.

Note that the widths or pitches of the first and second grooves 812 and 832 may be set arbitrarily without a particular limitation. The width of the first groove 812 may be equal to the width of the second groove 832, or they may be different from each other. Similarly, the pitch of the first groove 812 may be equal to the pitch of the second groove 832, or they may be different from each other. An intersecting angle between the first and second grooves 812 and 813 (that is, an intersecting angle between the first and second directions) may be set to any angle other than the right angle. The protrusion 45 may have any truncated square pyramid shape by changing the widths or pitches of the first and second grooves 812 and 832 and the intersecting angle between the first and second directions.

As illustrated in FIGS. 7(a) to 8, each protrusion 45 has a truncated square pyramid cross-sectional shape including a tip end surface 451 and four side surfaces 452. Each side surface 452 is inclined at a slope smaller than 90° (θ<90°) against a flat surface substantially in parallel with the bottom surface 441 of the first sintering layer 44 subjected to the pressing. An interval between a pair of opposing side surfaces 452 is reduced toward the tip end surface 451. Note that the slope angle θ of one side surface 452 may be equal to the slope angle θ of the other side surface 452, or they may different from each other.

In this step S24, the tip end surface 451 of the protrusion 45 receives nearly no pressure from the compressing rollers 81 to 84. In addition, upper parts of the side surfaces 452 of the protrusion 45 merely receive a weak pressure from the pressing rollers 81 to 84. For this reason, a lot of voids of the porous structure generated during the photo-sintering remain in the tip end surface 451 or the side surfaces 452 of the protrusion 45. In contrast, the bottom surface 441 of the first sintering layer 44 other than the protrusion 45 is strongly pressed by the compressing rollers 81 to 84. For this reason, in the bottom surface 441 of the first sintering layer 44, the porous structure generated during the photo-sintering is crushed, so that there is nearly no void.

Note that the first sintering layer 44 may also be pressed using only a set of compressing rollers 81 and 82 as illustrated in FIGS. 9(a) and 9(b). In this case, instead of the protrusions 45, a plurality of straightly extending walls 46 arranged substantially in parallel with each other are formed on the surface of the first sintering layer 44. The compressing rollers 81 and 82 in this example correspond to an example of the pressing tool in one or more embodiments of the invention. The wall 46 in this example corresponds to an example of the convex portion in t one or more embodiments of the invention.

The first sintering layer 44 may be pressed using a set of compressing rollers 81B and 82 as illustrated in FIGS. 10(a) and 10(b). In this example, a plurality of concave portions 814 is formed on the pressing surface 813 of the pressing roller 81B through laser machining or the like. The plurality of concave portions 814 are shaped to correspond to the protrusions 45B and are arranged in a matrix shape corresponding to the arrangement of the protrusions 45B. By forming the protrusion 45B using such a pair of compressing rollers 81B and 82, it is possible to form the protrusion in any shape other than the truncated conical shape and arbitrarily set the interval or the arrangement of the protrusions. Note that, although the protrusion 45B has a truncated conical shape in this example as illustrated in FIGS. 10(a) and 10(b), the shape of the protrusion 45B is not limited thereto. For example, the protrusion 45B may have a truncated square pyramid shape as described above. The compressing rollers 81B and 82 in this example correspond to an example of the pressing tool in one or more embodiments of the invention. The protrusion 45B in this example corresponds to an example of the convex portion in one or more embodiments of the invention.

Although not shown in the drawings, instead of the compressing rollers 81 to 84, the protrusion may also be formed on the first sintering layer by pressing a mold having a plurality of concave portions corresponding to the protrusions onto the first sintering layer using a presser or the like. When the protrusion is formed using this manner, the protrusion may have a trapezoidal cross-sectional shape as described above. Alternatively, the protrusion may also have a rectangular or square shape. In this case, the side surface of the protrusion has a slope angle θ of 90° (θ=90°). The mold in this example corresponds to an example of the pressing tool in one or more embodiments of the invention.

Returning to FIG. 1, as the first sintering layer 44 is pressed. In step S24, a second ink layer 51 is formed on the uneven surface of the first sintering layer 44 using the same method as that of step S21 in step S31 as illustrated in FIG. 4(a). The metal oxide ink of the second ink layer 51 may be formed using the materials listed in the aforementioned description of step S21. The ink having the same composition as that of the metal oxide ink used in step S21 may be employed, or ink having a different composition may also be employed. As a method of coating the metal oxide ink on the first sintering layer 44, the methods listed in the aforementioned description of the step S21 may be employed. The same method as that of step S21 may be employed, or a different method may also be employed.

In step S31, the metal oxide ink is coated on the surface of the first sintering layer 44 as thick as the tip end surface 451 of the protrusion 45 is thinly covered by the second ink layer 51 as illustrated in FIG. 11. In this case, since most of the coated metal oxide ink floats between the protrusions 45, the second ink layer 51 deposited on the bottom surface 441 between the protrusions 45 is thickened. Meanwhile, the second ink layer 51 deposited on and around the tip end surface 451 of the protrusion 45 is thinned inevitably.

Here, if the metal oxide ink is coated on a sintering layer having no protrusion, it is difficult to deposit the metal oxide ink on the flat sintering layer, and the metal oxide k flows out from the top surface of the sintering layer to the surrounding. Therefore, if no protrusion is formed on the sintering layer, a coat thickness of the metal oxide ink of the second and subsequent layers is excessively thinned. Therefore, the number of coats remarkably increases. In this regard, in one or more embodiments, a plurality of protrusions 45 are provided on the first sintering layer 44 in a matrix shape.

Therefore, in step S31, it is possible to easily deposit the metal oxide ink using a surface tension and cover the tip end surface 451 of the protrusion 45 with the stable second ink layer 51.

In this step S31, since voids of the porous structure remain in the tip end surface 451 and the side surfaces 452 of the protrusion 45, a part of the metal oxide ink is infiltrated into the tip end surface 451 and the side surfaces 452 of the protrusion 45. In contrast, since the bottom surface 441 of the first sintering layer 44 is strongly pressed in the aforementioned step S24 to crush the voids, the metal oxide ink is not infiltrated into the bottom surface 441.

Then, in step S32 of FIG. 1, the solvent is removed by drying the second ink layer 51 using the same method as that of step S22 described above as illustrated in FIG. 4(b), so that a second metal oxide layer 52 is formed. The second metal oxide layer 52 corresponds to an example of the precursor layer in one or more embodiments of the invention.

In this step S32, a first portion 521 of the second metal oxide layer 52 that covers the bottom surface 441 of the first sintering layer 44 is formed to be thick, and a second portion 522 that covers the tip end surface 451 of the protrusion 45 and its surrounding is formed to be thin as illustrated in FIG. 12. In addition, a part of the metal oxide ink infiltrated into voids of the porous structure of the tip end surface 451 and the side surfaces 452 of the protrusion 45 is also dried so as to form a second metal oxide layer 53a.

Then, in step S33 of FIG. 1, pulse light is irradiated from the light source 70 to the second metal oxide layer 52 using the same method as that of the aforementioned step S23 as illustrated in FIG. 4(c). As a result, a reduction reaction and metal sintering of the metal oxide particles are progressed from the top face of the second metal oxide layer 52, so that a second sintering layer 54 is formed. Note that, as the light source 70 used in this step S33, the light sources listed in the description of the aforementioned step S23 may be employed. The same light source as that of step S23 may be employed, or other light sources may be employed. The irradiation energy or the irradiation time of the pulse light irradiated. In step S33 may be set to the same values as those of the aforementioned step S23 or other values.

In this step S33, the second portion 522 of the second metal oxide layer 52 and the second metal oxide layer 53a are formed to be thin, and a large amount of pulse light is irradiated from the light source 70 to the second portion 522 and the second metal oxide layer 53a. For this reason, the reduction reaction and the sintering reaction in the second portion 522 and the second metal oxide layer 53a are instantaneously progressed. As a result, the second metal oxide layers 52 and 53a are perfectly changed to the sintering layer as illustrated in FIG. 13 without remaining metal oxide. Therefore, the protrusion 45 and the second sintering layer 54 are securely electrically conducted. In addition, since the second metal oxide layer 53a is formed in the voids of the porous structure of the tip end surface 451 and the side surfaces 452 of the protrusion 45, the second sintering layer 54 is firmly fixed to the protrusion 45 of the first sintering layer 44. In contrast, since the first portion 521 of the second metal oxide layer 52 is formed to be thick, the second metal oxide layer 53b containing unreacted metal oxides remains in the lower layer portion of the second metal oxide layer 52. Note that, in FIG. 13, the solid line indicates that the metal oxide layer is not interposed between the protrusion 45 and the second sintering layer 54 and they are electrically conducted.

If pulse light having energy capable of reducing and sintering the lower layer portion of the upper metal oxide layer when the conductive layer is formed by overlapping the flat sintering layers, re-oxidization and curing are progressed in the surface layer portion of the metal oxide layer, so that the metal oxide layer may be exfoliated or scattered.

Then, in step S34 of FIG. 1, two sets of compressing rollers 81 to 84 are used to compress the second sintering layer 54 through the same method as that of the aforementioned step S24, so that the surface of the second sintering layer 54 is formed in an uneven shape as illustrated in FIGS. 5(a) and 5(b). As a result, a plurality of protrusions 55 arranged in a matrix shape are formed on the surface of the second sintering layer 54.

Note that, in this step S34, the same roller as that used in step S24 or rollers may also be employed. In addition, instead of the protrusions 55, a plurality of straightly extending walls arranged in parallel with each other may also be formed on the surface of the second sintering layer 54 only using a set of compressing rollers 81 and 82 illustrated in FIGS. 9(a) and 9(b) described above. Alternatively, protrusions having a truncated conical shape may also be formed on the surface of the second sintering layer 54 using a set of compressing rollers 81B and 82 illustrated in FIGS. 10(a) and 10(b) described above.

Then, step S41 of FIG. 1, a third ink layer 61 is formed on the uneven surface of the second sintering layer 54 using the same method as that of step S31 described above as illustrated in FIG. 5(c). The metal oxide ink of the third ink layer 61 may be formed using the materials listed in the aforementioned description of step S21. The ink having the same composition as that of the metal oxide ink used in step S31 may be employed, or having a different composition may be employed. As a method of coating the metal oxide ink on the second sintering layer 54, the methods listed in the aforementioned description of the step S21 may be employed. The same method as that of step S31 may be employed, or a different method may also be employed.

Similarly, in this step S41, the metal oxide ink is coated on the surface of the second sintering layer 54 as thick as the tip end surface of the protrusion 55 is thinly covered by the third ink layer 61 using the same method as that of the aforementioned step S31. In this case, as most of the metal oxide ink floats between the protrusions 55, and the third ink layer 61 deposited on the bottom surface 541 between the protrusions 55 is thickened. Meanwhile, the third ink layer 61 deposited on and around the tip end surface of the protrusion 55 is thinned inevitably.

In this step S41, since voids of the porous structure remain in the tip end surface and the side surfaces of the protrusion 55 as in the aforementioned step S31, a part of the metal oxide ink is infiltrated into the tip end surface and the side surfaces of the protrusion 55. In contrast, since the bottom surface 541 of the second sintering layer 54 is strongly pressed in the aforementioned step S34 to crush the voids, the metal oxide ink is not infiltrated into the bottom surface 541.

Then, in step S42 of FIG. 1, the solvent is removed by drying the third ink layer 61 using the same method as that of the aforementioned step S32 as illustrated in FIG. 6(a), so that a third metal oxide layer 62 is formed. The third metal oxide layer 62 corresponds to an example of the precursor layer in one or more embodiments of the invention.

In this step S42, a first portion 621 of the third metal oxide layer 62 placed on the bottom surface 541 of the second sintering layer 54 is formed to be thick, and a second portion 622 placed on the tip end surface of the protrusion 55 and its surrounding is formed to be thin as in the aforementioned step S32. In addition, a part of the metal oxide ink infiltrated into voids of the porous structure of the tip end surface and the side surface of the protrusion 55 is also dried so as to form the third metal oxide layer 63a.

Then, in step S43 of FIG. 1, pulse light is irradiated from the light source 70 to the third metal oxide layer 62 using the same method as that of the aforementioned step S33 as illustrated in FIG. 6(b). As a result, a reduction reaction and metal sintering of the metal oxide particles are progressed from the top face of the third metal oxide layer 62, so that a third sintering layer 64 is formed. Note that, as the light source 70 used in this step S43, the light sources listed in the description of the aforementioned step S23 may be employed. The same light source as that of step S33 may be employed, or other light sources may be employed. The irradiation energy or the irradiation time for the pulse light irradiated in step S43 may be set to the same values as those of the aforementioned step S33 or other values.

In this step S43, the second portion 622 of the third metal oxide layer 62 sand the third metal oxide layer 63a are formed to be thin, and a large amount of the pulse light is irradiated from the light source 70 to the second portion 622 and the third metal oxide layer 63a as in the aforementioned step S33. For this reason, the reduction reaction and the sintering reaction in the second portion 622 and the third metal oxide layer 63a are instantaneously progressed. As a result, the third metal oxide layers 62 and 63a are perfectly changed to the sintering layer without remaining metal oxide. Therefore, the protrusion 55 and the third sintering layer 64 are securely electrically conducted. In addition, since the third metal oxide layer 63a is formed in the voids of the porous structure of the tip end surface and the side surfaces of the protrusion 55, the third sintering layer 64 is firmly fixed to the protrusion 55 of the second sintering layer 54. In contrast, since the first portion 621 of the third metal oxide layer 62 is formed to be thick, the third metal oxide layer 63b containing unreacted metal oxides remains in the lower layer portion of the third metal oxide layer 62.

Then, in step S44 of FIG. 1, the conductive layer 30 is completed by compressing the third sintering layer 64 using a set of compressing rollers 91 and 92 as illustrated in FIG. 6(c).

The pressing roller 91 is a cylindrical roller made of a metal material such as stainless steel and has a smooth pressing surface 911 subjected to mirror finishing. Similarly, the pressure-receiving roller 92 is a cylindrical roller made of a metal material such as stainless steel and has a smooth pressure-receiving surface 921. The pressure-receiving roller 92 is arranged oppositely to the pressing roller 91. As the substrate 20 provided with the third sintering layer 64 passes between the pressing rollers 91 and 92, all of the voids of the porous structure of the first to third sintering layers 44, 54, and 64 are crushed, and the surface of the third sintering layer 64 is formed to be flat.

Note that, instead of the compressing rollers 91 and 92, the surface of the third sintering layer may be flattened by pressing a mold having a flat surface to the third sintering layer using a presser or the like.

Figure 15:
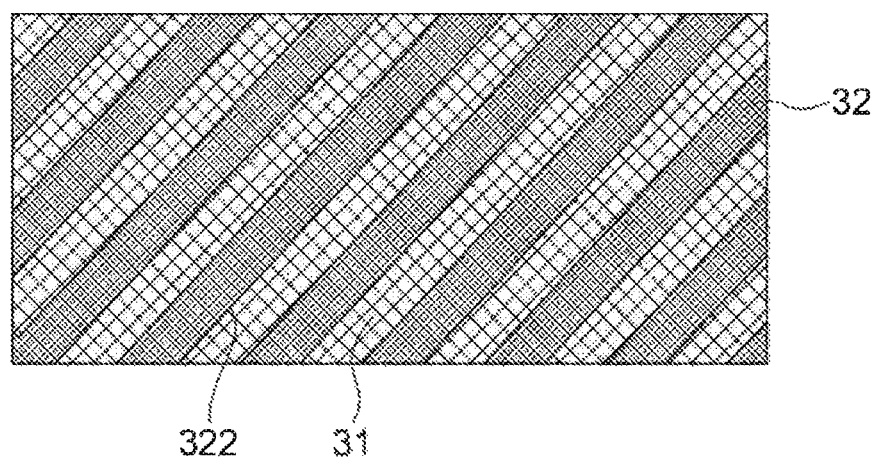
FIG. 15 is a cross-sectional view illustrating a modification of the wiring hoard in one or more embodiments of the invention and corresponding to FIG. 14(b).

FIGS. 14(a) and 14(b) are diagrams illustrating a structure of the wiring board in one or more embodiments, and FIG. 15 is a diagram illustrating a modification of the wiring board.

As described above, the conductive layer 30 formed on the substrate 20 is used as a conductive part of the wiring board 10, such as a wiring pattern, a land, or a pad. This conductive layer 30 includes the conductive portion 31 and the first and second insulating portions 32 and 33 as illustrated in FIGS. 14(a) and 14(b). The conductive portion 31 contains a metal material such as copper (Cu), silver (Ag), molybdenum (Mo), and tungsten (W) and has electric conductivity. In contrast, the first and second insulating portions 32 and 33 contain metal oxide such as copper oxide ($Cu_2O$, CuO), silver oxide ($Ag_2O$), molybdenum oxide ($MoO_2$, $MoO_3$), and tungsten oxide ($WO_2$, $WO_3$) and have an electric insulation properly.

The first insulating portion 32 is buried in the conductive portion 31 and extends in layered state along substantially the same direction as the extending direction of the substrate 20. Similarly, the second insulating portion 33 is also buried in the conductive portion 31 and extends in layered state along substantially the same direction as the extending direction of the substrate 20. That is, in one or more embodiments, formation of the sintering layers 44, 54, and 64 are repeated three times in the manufacturing method described above. Therefore, two layers of the insulating portions 32 and 33 are formed in the conductive portion 31.

The first insulating portion 32 is provided with a plurality of through-holes 321 where the conductive portion 31 vertically penetrates. The through-holes 321 have a rectangular shape corresponding to a root portion of the protrusion 45 described above and are arranged in a matrix shape corresponding to the arrangement of the protrusion 45. The insulating portion 32 corresponds to the second metal oxide layer 53b described in the aforementioned manufacturing method.

The second insulating portion 33 is also provided with a plurality of through-holes 331 where the conductive portion 31 vertically penetrates. The through-holes 331 have a rectangular shape corresponding to a root portion of the protrusion 55 described above and are arranged in a matrix shape corresponding to the arrangement of the protrusions 55. The second insulating portion 33 corresponds to the third metal oxide layer 63b described in the manufacturing method described above.

Note that, if the walls 46 are provided as the convex portion on the sintering layer 44 only using a set of compressing rollers 81 and 82 illustrated in FIGS. 9(a) and 9(b) in step S24 described above, a plurality of slits 322 where the conductive portion 31 vertically penetrates are formed in the first insulating portion 32 instead of the through-hole 321 as illustrated in FIG. 15. The slits 322 straightly extend to correspond to the first grooves 812 of the first pressing roller 81 and are arranged substantially in parallel with each other.

Similarly, although not shown in particular, even when the walls are provided as the convex portion in the sintering layer 54 only using a set of compressing rollers 81 and 82 illustrated in FIGS. 9(a) and 9(b) in step S34, a plurality of slits where the conductive portion 31 vertically penetrates are formed in the second insulating portion 33 instead of the through-holes 331.

As described above, in one or more embodiments, when the sintering layer formation process S20, S30, and S40 including the steps S24, S34, and S44 for compressing the sintering layer is repeated three times, the first and second compressing steps S24 and S34 include a process of forming the surfaces of the sintering layers 44 and 54 in an uneven shape. Since the metal oxide layers 52 and 62 are formed on the uneven surfaces of the sintering layers 44 and 54, the metal oxide layers 52 and 62 are thinned in the tip end surfaces 451 or the side surfaces 452 of the protrusions 45 and 55 of the sintering layers 44 and 54. Therefore, it is possible to perfectly reduce the oxide without a residue. For this reason, even when the conductive layer is thickened, it is possible to secure electric conduction between the sintering layers. Therefore, it is possible to form the conductive layer having a desired thickness using the photo-sintering process.

The steps S21, S22, S31, S32, S41, and S42 correspond to an example of the first process in one o e embodiments of the invention. The steps S23, S33, and S43 correspond to an example of the second process in one or more embodiments of the invention. The steps S24, S34, and S44 correspond to an example of the third process in one or more embodiments of the invention.

The embodiments described herein above are presented in order to facilitate understanding of the present invention and are not presented to limit the present invention. Thus, the respective elements disclosed in the above embodiments are intended to cover all design alterations belonging to the technical scope of the present invention and equivalents thereof.

Although the sintering layer formation process S20, S30, and S30 is repeated three times in the aforementioned embodiments, the invention is not particularly limited thereto as long as the sintering layer formation process is repeated "N" times. For example, the sintering layer formation process may also be repeated two times. Alternatively, the sintering layer formation process may also be repeated four or more times. Here, "N" denotes a natural number equal to or greater than "2."

In this case, the surface of the sintering layer is formed in an uneven shape using two sets of compressing rollers 81 to 84 illustrated in FIGS. 7(a) and 7(b) in the first to (N−1)th compressing processes. Meanwhile in the final (N)th compressing process, the surface of the sintering layer is formed to be smooth using the compressing rollers 91 and 92 described in step S44. The conductive layer formed in this manner has (N−1) layers of the insulating portion in the conductive portion.

Note that, in the first to (N−1)th compressing processes, a set of compressing rollers 81 and 82 illustrated in FIGS. 9(a) and 9(b) may be employed. Alternatively, a set of compressing rollers 81B and 82 illustrated in FIGS. 10(a) and 10(b) may be employed. Alternatively, a compressing roller having the same type as that of the first to (N−1)th compressing processes may be employed. Other types of the compressing roller may also be employed.

For example, if the sintering layer formation process is repeated two times, the surface of the sintering layer is formed in an uneven shape using two sets of compressing rollers 81 to 84 illustrated in FIGS. 7(a) and 7(b) in the first compressing process. Meanwhile, in the second compressing process, the surface of the sintering layer is formed to be smooth using the compressing rollers 91 and 92 described in the aforementioned step S44. Although not shown in particular, the conductive layer formed in this manner has only one layer of the insulating portion in the conductive portion.

If the sintering layer formation process is repeated four times, the surface of the sintering layer is formed in an uneven shape using two sets of compressing rollers 81 to 84 illustrated in FIGS. 7(a) and 7(b) in the first to third compressing process. Meanwhile, in the fourth compressing process, the surface of the sintering layer is formed to be smooth using the compressing rollers 91 and 92 described in the aforementioned step S44. Although not show in particular, the conductive layer formed in this manner has three layers of the insulating portion inside the conductive portion.

In the aforementioned embodiments, the conductive layer is formed on the substrate. However, a target for forming the conductive layer is not particularly limited to the substrate. Instead, the conductive layer may also be formed on a support body other than the substrate using the manufacturing method according to one or more embodiments of the invention.

EXPLANATIONS OF LETTERS OR NUMERALS 10 wiring board
20 substrate
  21 base material
  22 porous layer
30 conductive layer
  31 conductive portion
  32 first insulating portion
    321 through-hole
    322 slit
  33 second insulating portion
    331 through-hole
41 first ink layer
42 first metal oxide layer
43a, 43b first metal oxide layer
44 first sintering layer
  441 bottom surface
  45, 45B protrusion
    451 tip end surface
    452 side surface
46 wall
51 second ink layer
52 second metal oxide layer
  521 first portion
  522 second portion
53a, 53b second metal oxide layer
54 second sintering layer
  541 bottom surface
  55 protrusion
61 third ink layer
62 third metal oxide layer
  621 first portion
  622 second portion
63a, 63b third metal oxide layer
64 third sintering layer
70 light source
81, 81B first pressing roller
  811 pressing surface
    812 first groove
  813 pressing surface
    814 concave portion
82 first pressure-receiving roller
  821 pressure-receiving surface
83 second pressing roller
  831 pressing surface
    832 second groove
84 second pressure-receiving roller
  841 pressure-receiving surface
91 pressing roller
92 pressure-receiving roller

The invention claimed is:
1. A method of manufacturing a conductive layer on a support body, the method comprising:
a first process of forming a precursor layer containing at least one of metal particles and metal oxide particles on the support body;

a second process of forming a sintering layer by irradiating an electromagnetic wave pulse on the precursor layer; and a third process of compressing the sintering layer, wherein the conductive layer is formed by repeating the first to third processes "N" times, where "N" denotes a natural number equal to or greater than 2, on the same location of the support body, and the third process performed in the first to (N−1)th operations includes forming a surface of the sintering layer in an uneven shape.

2. The method according to claim 1, wherein the uneven surface of the sintering layer compressed in the third process of the first to (N−1)th operations includes convex portions, and each of the convex portions has a trapezoidal cross-sectional shape narrowed toward a tip end surface or a rectangular cross-sectional shape.

3. The method according to claim 2, wherein the convex portions include protrusions arranged in a matrix shape.

4. The method according to claim 3, wherein at least one of the third processes performed in the first to (N−1)th operations includes forming the surface of the sintering layer in an uneven shape by pressing a first pressing tool to the surface of the sintering layer and then pressing a second pressing tool to the surface of the sintering layer, the first pressing tool has a first pressing surface including first grooves that extend along a first direction and are arranged in parallel with each other, and the second pressing tool has a second pressing surface including second grooves that extend along a second direction crossing the first direction and are arranged in parallel with each other.

5. The method according to claim 3, wherein at least one of the third processes performed in the first to (N−1)th operations includes forming the surface of the sintering layer in an uneven shape by pressing a pressing tool to the surface of the sintering layer, the pressing tool has a pressing surface including concave portions shaped to correspond to the protrusions, and the concave portions are arranged on the pressing surface to correspond to the arrangement of the protrusions.

6. The method according to claim 2, wherein the convex portions include walls extending along a first direction, and the walls are arranged in parallel with each other.

7. The method according to claim 6, wherein at least one of the third processes performed in the first to (N−1)th operations includes forming the surface of the sintering layer in an uneven shape by pressing a pressing tool to the surface of the sintering layer, and the pressing tool has a pressing surface including grooves that extend along the first direction and are arranged in parallel with each other.

8. The method according to claim 1, wherein the first process includes:

arranging a dispersion liquid containing at least one of the metal particles and the metal oxide particles on the support body; and forming the precursor layer by drying the dispersion liquid.

9. The method according to claim 1, wherein the third process of the (N)th operation includes forming the surface of the sintering layer in a flat shape.

* * * * *